(12) United States Patent
Yu et al.

(10) Patent No.: US 9,082,865 B2
(45) Date of Patent: Jul. 14, 2015

(54) SPLIT-GATE TYPE NONVOLATILE MEMORY DEVICE, SEMICONDUCTOR DEVICE HAVING SPLIT-TYPE NONVOLATILE MEMORY DEVICE EMBEDDED THEREIN, AND METHODS OF FORMING THE SAME

(71) Applicant: Samsung Electronics Co., Ltd., Suwon-si (KR)

(72) Inventors: Tea-Kwang Yu, Gyeonggi-do (KR); Kwang-Tae Kim, Gyeonggi-do (KR); Yong-Tae Kim, Gyeonggi-do (KR); Bo-Young Seo, Gyeonggi-do (KR); Yong-Kyu Lee, Gyeonggi-do (KR); Hee-Seog Jeon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 227 days.

(21) Appl. No.: 13/743,445

(22) Filed: Jan. 17, 2013

(65) Prior Publication Data

US 2013/0242659 A1 Sep. 19, 2013

(30) Foreign Application Priority Data

Mar. 13, 2012 (KR) .................. 10-2012-0025643

(51) Int. Cl.
| | | |
|---|---|---|
| *H01L 29/78* | (2006.01) | |
| *H01L 29/788* | (2006.01) | |
| *G11C 16/04* | (2006.01) | |
| *H01L 29/10* | (2006.01) | |
| *H01L 27/115* | (2006.01) | |

(52) U.S. Cl.
CPC .......... *H01L 29/788* (2013.01); *G11C 16/0425* (2013.01); *G11C 16/0441* (2013.01); *H01L 27/11529* (2013.01); *H01L 29/1083* (2013.01); *H01L 29/1087* (2013.01); *H01L 29/7885* (2013.01)

(58) Field of Classification Search
CPC ...................................... H01L 29/788
USPC ............. 365/185.14, 185.02, 185.27; 257/314–316, 319, E29.3
See application file for complete search history.

(56) References Cited

U.S. PATENT DOCUMENTS

| | | | | |
|---|---|---|---|---|
| 5,514,889 A | * | 5/1996 | Cho et al. ............ | 257/316 |
| 6,274,436 B1 | * | 8/2001 | Kao et al. ............ | 438/267 |
| 6,795,342 B1 | * | 9/2004 | He et al. ............. | 365/185.16 |

(Continued)

FOREIGN PATENT DOCUMENTS

| | | |
|---|---|---|
| KR | 1020050027323 | 3/2005 |
| KR | 1020060110194 | 10/2006 |

(Continued)

*Primary Examiner* — Vanthu Nguyen
(74) *Attorney, Agent, or Firm* — Myers Bigel Sibley & Sajovec, P.A.

(57) ABSTRACT

A split-gate type nonvolatile memory device includes a semiconductor substrate having a first conductivity type, a deep well having a second conductivity type in the semiconductor substrate, a pocket well having the first conductivity type in the deep well, a source line region having the second conductivity type in the pocket well, an erase gate on the source line region, and a first floating gate and a first control gate stacked sequentially on the pocket well on a side of the erase gate. The pocket well is electrically isolated from the substrate by the deep well, so that a negative voltage applied to the pocket well may not adversely affect operation of other devices formed on the substrate.

16 Claims, 5 Drawing Sheets

(56) References Cited

U.S. PATENT DOCUMENTS

| | | | |
|---|---|---|---|
| 6,876,031 B1 * | 4/2005 | Kao et al. | 257/315 |
| 6,992,929 B2 * | 1/2006 | Chen et al. | 365/185.17 |
| 7,046,552 B2 * | 5/2006 | Chen et al. | 365/185.17 |
| 7,688,648 B2 * | 3/2010 | Kim | 365/189.14 |
| 7,701,767 B2 * | 4/2010 | Chu et al. | 365/185.14 |
| 7,800,159 B2 * | 9/2010 | Widjaja et al. | 257/316 |
| 2011/0032766 A1 * | 2/2011 | Fang et al. | 365/185.18 |

FOREIGN PATENT DOCUMENTS

| | | |
|---|---|---|
| KR | 1020070001687 | 1/2007 |
| KR | 1020070085021 | 8/2007 |

* cited by examiner

SPLIT-GATE TYPE NONVOLATILE MEMORY DEVICE, SEMICONDUCTOR DEVICE HAVING SPLIT-TYPE NONVOLATILE MEMORY DEVICE EMBEDDED THEREIN, AND METHODS OF FORMING THE SAME

This application claims priority from Korean Patent Application No. 10-2012-0025643 filed on Mar. 13, 2012 in the Korean Intellectual Property Office, the disclosure of which is incorporated herein by reference in its entirety.

BACKGROUND

1. Field of the Inventive Concept

The inventive concepts described herein relate to split-gate type nonvolatile memory devices and semiconductor devices having split-gate type nonvolatile memory devices embedded therein.

2. Description of the Related Art

A split-gate nonvolatile memory device is a type of nonvolatile memory device that may include, but is not limited to, a select gate, a floating gate, a control gate, and an erase gate. To program or erase a split-gate type nonvolatile memory device, a high voltage may be required.

A split-gate type nonvolatile memory device may be embedded in a semiconductor device, such as a logic chip, and may be used as a memory element therein. To obtain a high voltage required for program and erase operations of the split-gate type nonvolatile memory device, it may be desirable to form the device with a deep lightly doped drain (LDD) junction. However, as the integration density of semiconductor devices increases, the gate thickness of devices is made smaller. This may make it difficult to form a deep LDD junction, which may in turn make it difficult to obtain a high voltage.

If a high voltage at a required level cannot be obtained, the efficiency of the program operation of the slit-gate type nonvolatile memory device may be reduced. In this regard, it is desirable to find a way to increase the programming efficiency of a split-gate nonvolatile memory device embedded in a semiconductor device.

SUMMARY

Aspects of the present inventive concepts provide a split-gate type nonvolatile memory device and a semiconductor device having the split-gate type nonvolatile memory device embedded therein, in which a negative voltage can be applied to a pocket well to increase the efficiency of a program operation.

However, aspects of the present inventive concept are not restricted to the one set forth above. The above and other aspects of the present inventive concept will become more apparent to one of ordinary skill in the art to which the present inventive concept pertains by referencing the detailed description of the present inventive concept given below.

According to an aspect of the present inventive concept, there is provided a split-gate type nonvolatile memory device including a semiconductor substrate having a first conductivity type, a deep well having a second conductivity type in the semiconductor substrate, a pocket well having the first conductivity type in the deep well, a source line region having the second conductivity type in the pocket well, an erase gate on the source line region, and a first floating gate and a first control gate stacked sequentially on the pocket well on a first side of the erase gate.

According to another aspect of the present inventive concept, there is provided a semiconductor device including a semiconductor substrate having a first conductivity type that includes a first region and a second region, a deep well having a second conductivity type in the first region, a pocket well having the first conductivity type in the deep well, a split-gate type nonvolatile memory device on the pocket well and including a floating gate and a control gate, and a logic device on the second region.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
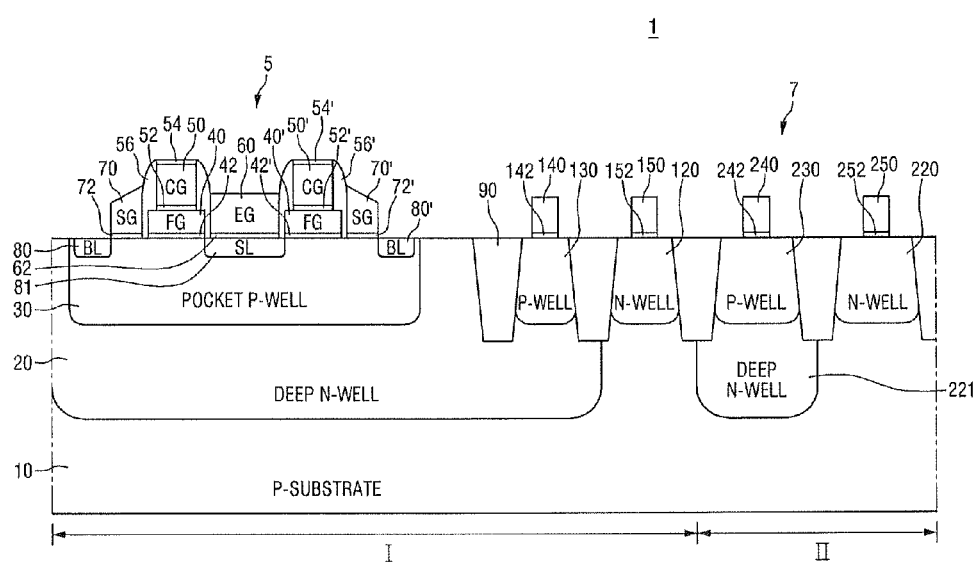
FIG. 1 is a cross-sectional view of a semiconductor device with an embedded split-gate type nonvolatile memory device according to some embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A semiconductor device having a split-gate type nonvolatile memory device embedded therein according to a first embodiment of the present inventive concept will now be described with reference to FIG. 1. FIG. 1 is a cross-sectional view of a semiconductor device 1 with an embedded split-gate type nonvolatile memory device 5 according to a first embodiment of the present inventive concept.

Referring to FIG. 1, the semiconductor device 1 may include a semiconductor substrate 10, a first deep well 20, a pocket well 30, the split-gate type nonvolatile memory device 5, and a logic device 7. Specifically, the semiconductor device 1 according to the first embodiment of the present inventive concept may be a semiconductor device including the split-gate type nonvolatile memory device 5.

The semiconductor substrate 10 may include a first region I and a second region II. The first region I of the semiconductor substrate 10 may be a nonvolatile memory cell region, and the nonvolatile memory device 5 may be formed on the first region I. A representative cell of the nonvolatile memory cell region is illustrated in FIG. 1, and the semiconductor device 1 is not limited to the illustration of FIG. 1. A high-voltage complementary metal oxide semiconductor (CMOS) may be formed on the first region I. Specifically, an n-channel metal oxide semiconductor (NMOS) gate 140 and a p-channel metal oxide semiconductor (PMOS) gate 150 may be formed on the first region I.

The second region II of the semiconductor substrate 10 may be a logic region, and the logic device 7 may be formed on the second region II. Specifically, an NMOS logic gate 240 and a PMOS logic gate 250 may be formed on the second region II. A CMOS formed on the second region II may be a medium- or low-voltage CMOS.

The semiconductor substrate 10 may be of a first conductivity type (e.g., a p type). Referring to the first region I, the first deep well 20 of a second conductivity type (e.g., an n type) may be formed in the semiconductor substrate 10. Part of the first deep well 20 may be overlapped by a region in which the nonvolatile memory device 5 is formed. The first deep well 20 may, but not necessarily, extend under the NMOS gate 140.

The pocket well 30 of the first conductivity type may be formed within the first deep well 20. The pocket well 30 may be surrounded by the first deep well 20. Specifically, both side surfaces and a bottom surface of the pocket well 30 may be surrounded by the first deep well 20. Since the pocket well 30 of the first conductivity type is surrounded by the first deep well 20 of the second conductivity type, the pocket well 30 and the semiconductor substrate 10 may be electrically isolated from each other. Therefore, even if a bias voltage is applied to the pocket well 30, it may not affect the semiconductor substrate 10.

A source line region 81 may be formed in the pocket well 30. Specifically, the source line region 81 may be formed by a dopant diffusion process or any other suitable doping process in an upper part of the pocket well 30. In addition, first and second bit line regions 80 and 80' may be formed on both sides of the source line region 81 to be separated from the source line region 81. The bit line regions 80 and 80' may be formed by a dopant diffusion process or any other suitable doping process. The source line region 81 may be connected to a common source line, and the first and second bit line regions 80 and 80' may be connected to a bit line. The source line region 81 and the first and second bit line regions 80 and 80' may be of the second conductivity type.

The nonvolatile memory device 5 may be formed on the pocket well 30. The nonvolatile memory device 5 may be a split-gate type nonvolatile memory device. Specifically, the split-gate type nonvolatile memory device 5 according to the first embodiment of the present inventive concept may include first and second floating gates 40 and 40', first and second control gates 50 and 50', an erase gate 60, and first and second select gates 70 and 70'. The first and second floating gates 40 and 40', the first and second control gates 50 and 50', the erase gate 60, and the first and second select gates 70 and 70' may all be located on the pocket well 30. The spirit of the present inventive concept can be applied to the nonvolatile memory device 5 as long as the nonvolatile memory device 5 is of a split-gate type and is not limited by the configuration and shape of the nonvolatile memory device 5.

The erase gate 60 may be formed over the source line region 81. The erase gate 60 may include a first side and a second side opposite the first side. A floating gate and a control gate may be sequentially stacked on both the first and second sides of the erase gate 60. Specifically, the first floating gate 40 and the first control gate 50 may be sequentially stacked on the pocket well 30 on the first side of the erase gate 60, and the second floating gate 40' and the second control gate 50' may be sequentially stacked on the pocket well 30 on the second side of the erase gate 60.

Specifically, an erase gate insulating layer 62 may be formed between the source line region 81 and the erase gate 60. First and second floating gate insulating layers 42 and 42' may be formed between the first and second floating gates 40 and 40' and the pocket well 30, respectively. In addition, first and second control gate insulating layers 52 and 52' may be formed between the first and second floating gates 40 and 40' and the first and second control gates 50 and 50', respectively. First and second control gate protection layers 54 and 54' may be formed on the first and second control gates 50 and 50', respectively. A first spacer layer 56 may be formed to cover opposing sides of the first floating gate 40 and the first control gate 50, and a second spacer layer 56' may be formed to cover opposing sides of the second floating gate 40' and the second control gate 50'. In addition, first and second select gate insulating layers 72 and 72' may be formed between the first and second select gates 70 and 70' and the pocket well 30, respectively. However, insulating layers and spacer layers formed between gates are not limited to the above examples.

The first select gate 70 may be located adjacent to the first bit line region 80. The first select gate 70 may be a first word line. The first select gate 70 may be formed between the first bit line region 80 and the source line region 81, and the first floating gate 40 and the first control gate 50 may be sequentially stacked on the pocket well 30 between the first select gate 70 and the erase gate 60.

Likewise, the second select gate 70' may be located adjacent to the second bit line region 80'. The second select gate 70' may be a second word line adjacent to the first word line. The second select gate 70' may be formed between the second bit line region 80' and the source line region 81, and the second floating gate 40' and the second control gate 50' may be sequentially stacked on the pocket well 30 between the second select gate 70' and the erase gate 60.

In summary, the first bit line region 80 and the source line region 81 which are separated from each other may be formed in the pocket well 30. In addition, the first floating gate 40, the first control gate 50, the erase gate 60 and the first select gate 70 may be positioned on the pocket well 30. Specifically, the first floating gate 40, the first control gate 50 and the first select gate 70 may be located between the first bit line region 80 and the source line region 81. The first select gate 70 may be located adjacent to the first bit line region 80. The first floating gate 40 and the first control gate 50 may be sequentially stacked adjacent to the source line region 81. The erase gate 60 may be formed on the source line region 81.

As described above, the NMOS gate 140 and the PMOS gate 150 may be formed as a high-voltage CMOS on the first region I of the semiconductor substrate 10. The NMOS gate 140 may be formed on a first well 130 of the first conductivity type which is formed in the semiconductor substrate 10. A first gate insulating layer 142 may be formed between the first well 130 and the NMOS gate 140. The first well 130 may be surrounded by the first deep well 20 and thus electrically insulated from the semiconductor substrate 10. That is, the first deep well 20 may extend to a region in which the NMOS gate 140 is formed.

The PMOS gate 150 may be formed on a second well 120 of the second conductivity type which is formed in the semiconductor substrate 10. A second gate insulating layer 152 may be formed between the second well 120 and the PMOS gate 150. In addition, a device isolation region 90 may be formed between the NMOS gate 140 and the PMOS gate 150.

The logic device 7 may be formed on the second region II of the semiconductor substrate 10. The logic device 7 may include the NMOS logic gate 240 and the PMOS logic gate 250. The NMOS logic gate 240 may be formed on a third well 230 of the first conductivity type which is formed in the semiconductor substrate 10. Specifically, the NMOS logic gate 240 may be separated from the pocket well 30. A third gate insulating layer 242 may be formed between the NMOS logic gate 240 and the third well 230. In addition, the third well 230 may be surrounded by a second deep well 221 and thus electrically insulated from the semiconductor substrate 10. The second deep well 221 may reinforce the isolation of the third well 230.

The PMOS logic gate 250 may be formed on a fourth well 220 of the second conductivity type which is formed in the semiconductor substrate 10. Specifically, the PMOS logic gate 250 may be separated from the pocket well 30. A fourth gate insulting layer 252 may be formed between the PMOS logic gate 250 and the fourth well 220.

Figure 2:
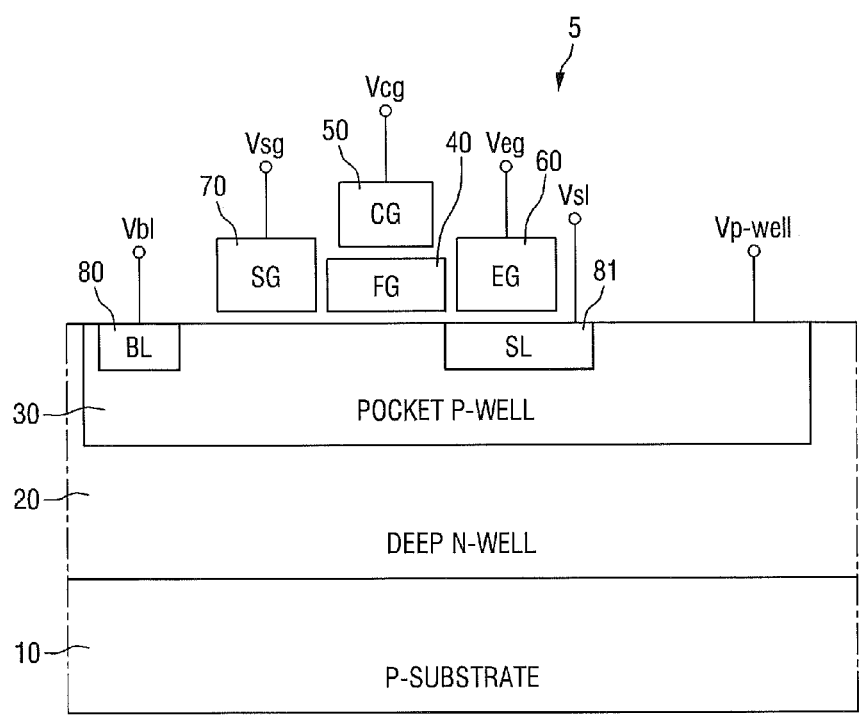
FIG. 2 is a schematic cross-sectional of the split-gate type nonvolatile memory device included in the semiconductor device of FIG. 1.

A programming method of the split-gate type nonvolatile memory device 5 according to the first embodiment of the present inventive concept will now be described with reference to FIG. 2. FIG. 2 is a schematic cross-sectional of the split-gate type nonvolatile memory device 5 included in the semiconductor device 1 of FIG. 1. For ease of description, only a region to which a bias voltage is applied is illustrated in FIG. 2.

TABLE 1

| Operation | Cell | Vsg | Vcg | Veg | Vbl | Vsl | Vp-well |
|---|---|---|---|---|---|---|---|
| PROGRAM | Selected | 0.5 V~3 V | 7 V~11 V | 3 V~11 V | 0 V~0.7 V | 3 V~7 V | −0.1 V~−2 V |

Referring to FIG. 2 and Table 1, a bias voltage applied to a selected cell during a program operation is as follows. The selected cell may be programmed by the injection of hot electrons generated from a channel region under the first floating gate 40. To generate hot electrons, a voltage of, e.g., 3 to 7 V may be applied to the source line region 81. Since a voltage higher than a threshold voltage (Vth) can be applied to the first select gate 70, a channel may be formed between the first bit line region 80 and the source line region 81. For example, a voltage of 0.5 to 3 V may be applied to the first select gate 70.

A high voltage may be applied to the first control gate 50 and the erase gate 60 in order to maximize a voltage coupled to the first floating gate 40. For example, a voltage of 7 to 11 V may be applied to the first control gate 50. If the voltage applied to the erase gate 60 is increased to a level equivalent to the level of the voltage applied to the first control gate 50, it may be advantageous in maximizing the voltage coupled to the first floating gate 40. However, an increase in the voltage applied to the erase gate 60 may cause a disturbance, and the disturbance may cause current to leak through the source line region 81 located adjacent to the erase gate 60. Therefore, to reduce the generation of leakage current, the voltage applied to the erase gate 60 may be maintained at a level equivalent to the level of the voltage applied to the source line region 81.

The nonvolatile memory device 5 according to the first embodiment of the present inventive concept is embedded in the semiconductor device 1 such as a logic chip and used as a memory element. To obtain a high voltage required for a program operation, it may be desirable to form a deep lightly doped drain (LDD) junction when a high-voltage CMOS is manufactured. However, in a logic process for manufacturing the semiconductor device 1 with the embedded spit-gate type nonvolatile memory device 5, the semiconductor device 1 is increasingly manufactured smaller, thus shrinking thicknesses of the NMOS and PMOS logic gates 240 and 250 of the logic device 7 which is a logic element. Since the reduced thicknesses of the NMOS and PMOS logics gates 240 and 250 may make it difficult to form the LDD junction of the high-voltage CMOS deeply, it may be more difficult to obtain a high voltage at a required level for a program operation. For example, if it is difficult to apply a high voltage of about 11 V to the first control gate 50, the voltage coupled to the first floating gate 40 may be reduced. As a result, the efficiency of a program operation by hot electron injection may decrease.

However, the split-gate type nonvolatile memory device 5 according to the first embodiment of the present inventive concept is formed on the pocket well 30, which is isolated from the p-well 130 of the high voltage NMOS device in the first region I and the p-well 230 of the low voltage NMOS device in the second region II. Therefore, a negative voltage can be applied to the pocket well 30. The negative voltage applied to the pocket well 30 increases a voltage difference between the pocket well 30 and the first control gate 50. Thus, a voltage difference required for a program operation can be secured. Accordingly, a stronger electric field is generated between the pocket well 30 and the first control gate 50. Hence, even if a high voltage is not applied to the first control gate 50, the efficiency of hot electron injection increases, which, in turn, increases the efficiency of a program operation. For example, the efficiency of hot electron injection may be increased by a CHannel Initiated Secondary ELectron (CHISEL) phenomenon.

Since the pocket well 30 of the first conductivity type is surrounded by the first deep well 20 of the second conductivity type, the pocket well 30 and the semiconductor substrate 10 are electrically isolated from each other. Therefore, even if a negative voltage is applied to the pocket well 30, it may not affect the second region II on which the logic device 7 is formed.

When a negative voltage is applied to the pocket well 30, the threshold voltage (Vth) of another unselected select gate may increase, and the increased threshold voltage may reduce the occurrence of a punch-through phenomenon. Consequently, the generation of leakage current can be reduced, thus reducing a gate length of a select gate.

A negative voltage applied to the pocket well 30 is not limited to a particular range but may be in a range of −0.1 to −2 V. A minimum value of the negative voltage applied to the pocket well 30 may decrease steadily as the split-gate type nonvolatile memory device 5 gradually shrinks.

−2V suggested as a maximum value of the negative voltage applied to the pocket well 30 is a value suggested to explain the fact that there is a limit to an increase in the negative voltage. As the negative voltage applied to the pocket well 30 increases, the efficiency of hot electron injection may increase further. However, as described above, a probability that current will leak through the source line region 81 may increase. In addition, there is a probability that current will leak through a select gate.

the first control gate 50 is limited, a negative voltage may be applied to the first control gate 50 to obtain the effect of applying a high voltage to the erase gate 60. That is, the efficiency of the erase operation can be increased by applying a negative voltage to the first control gate 50.

Figure 3:
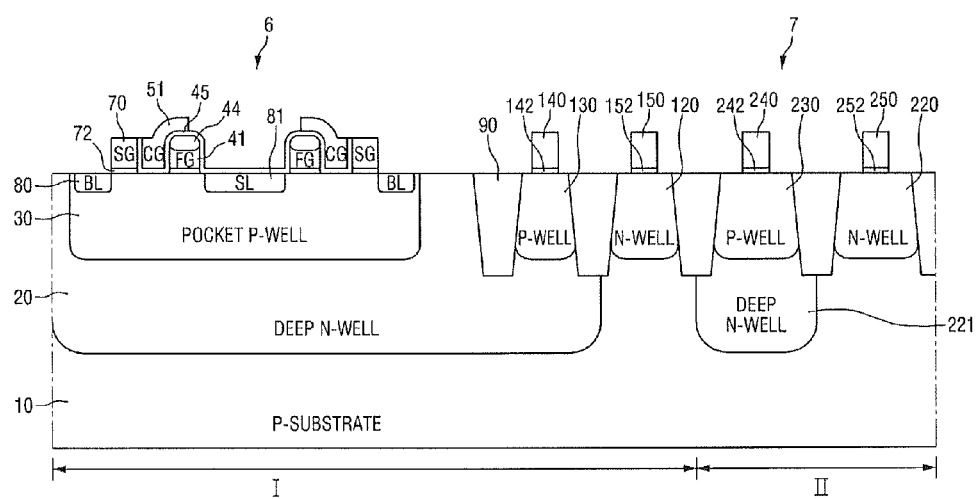
FIG. 3 is a cross-sectional view of a semiconductor device with an embedded split-gate type nonvolatile memory device according to further embodiments of the present inventive concept.
Figure 4:
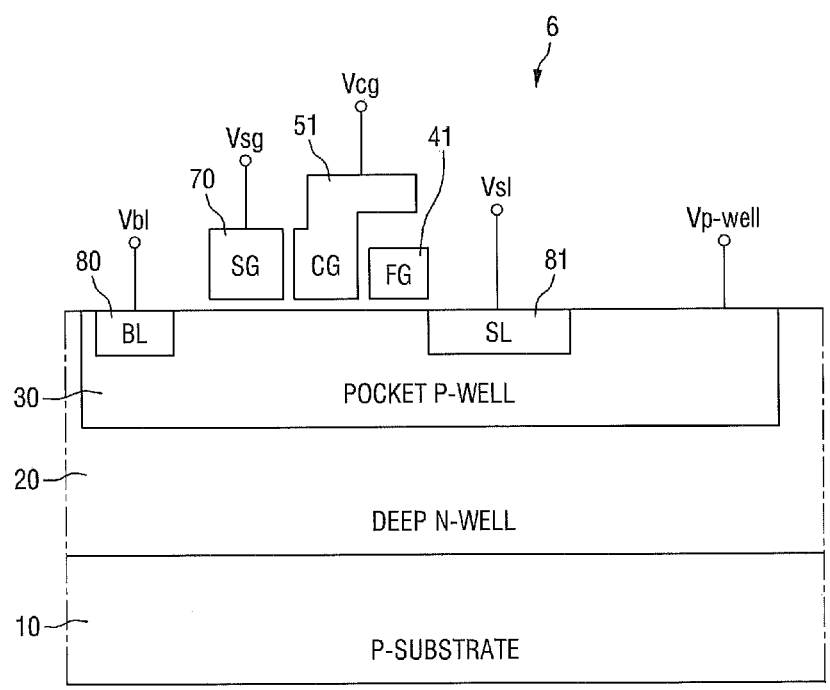
FIG. 4 is a schematic cross-sectional view of the split-gate type nonvolatile memory device included in the semiconductor device of FIG. 3.

A split-gate type nonvolatile memory device and a semiconductor device having the spit-gate type nonvolatile memory device embedded therein according to a second embodiment of the present inventive concept will now be described with reference to FIGS. 3 and 4. For simplicity, the following description will focus on differences from the split-gate type nonvolatile memory device 5 and the semiconductor device 1 having the split-gate type nonvolatile memory device 5 embedded therein according to the first embodiment of the present inventive concept. FIG. 3 is a cross-sectional view of a semiconductor device 2 with an embedded split-gate type nonvolatile memory device 6 according to a second embodiment of the present inventive concept. FIG. 4 is a schematic cross-sectional view of the split-gate type nonvolatile memory device 6 included in the semiconductor device 2 of FIG. 3.

Referring to FIGS. 3 and 4, the nonvolatile memory device 6 of the semiconductor device 2 does not include an erase gate. In addition, a third control gate 51 may be positioned between a first select gate 70 and a third floating gate 41. Specifically, the third control gate 51 may extend from beside the third floating gate 41 and overlap part of a top surface of the third floating gate 41.

A first insulating layer 44 may be formed on the third floating gate 41, and a second insulating layer 45 may be formed between the third floating gate 41 and the third control gate 51.

During a program operation of the split-gate type nonvolatile memory device 6 according to the second embodiment of the present inventive concept, a negative voltage may also be applied to a pocket well 30, thereby increasing the efficiency of the program operation.

Figure 5:
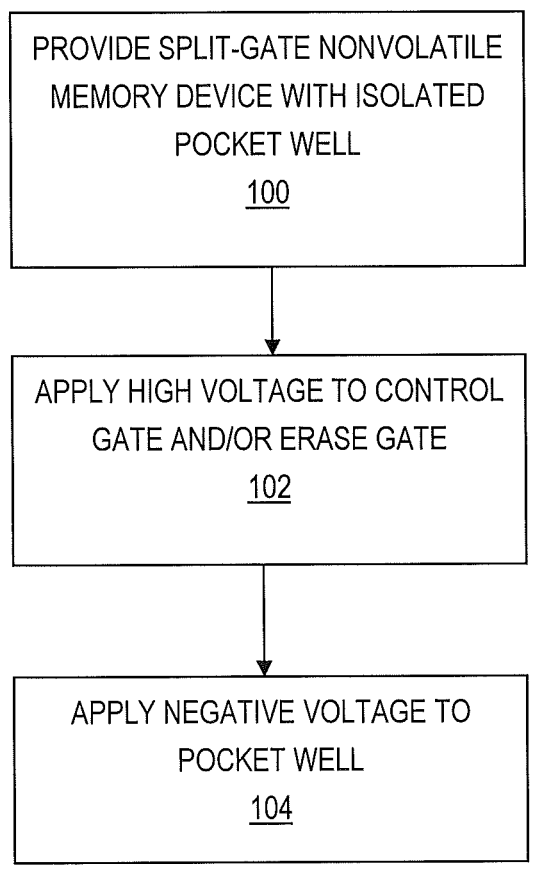
FIG. 5 is a flowchart that illustrates operations of programming a split-gate type nonvolatile memory device according to embodiments of the inventive concept.

For example, FIG. 5 is a flowchart that illustrates operations of programming a split-gate type nonvolatile memory device according to embodiments of the inventive concept. As shown therein, the operations include providing a split-gate

TABLE 2

| Operation | Cell | Vsg | Vcg | Veg | Vbl | Vsl | Vp-well |
|---|---|---|---|---|---|---|---|
| PROGRAM | Selected | 0.8 V | 9 V | 4.5 V | 0.2 V | 4.5 V | −1 V |
| | Unselected | 0 V | 0 V | 0 V | 1.1 V | 0 V | −1 V |
| ERASE | Selected | 0 V | −6 V | 9 V | 0 V | 0 V | 0 V |
| | Unselected | 0 V | 1.1 V | 0 V | 0 V | 0 V | 0 V |
| READ | Selected | 1.1 V | 1.1 V | 0 V | 0 V | 0.5 V | 0 V |
| | Unselected | 0 V | 0 V | 0 V | 0 V | 0 V | 0 V |

Table 2 shows example bias voltages applied during program, erase, and read operations of the nonvolatile memory device 5 according to the first embodiment of the present inventive concept. The applied bias voltages are not limited to values shown in Table 2. When necessary, a negative voltage may be applied to the pocket well 30 during the erase operation and the read operation.

Referring to Table 2, a negative voltage may be applied to the pocket well 30 during the program operation only. Specifically, a ground voltage may be applied to the pocket well 30 during the erase operation and the read operation.

During the erase operation, a voltage of about 9 V may be applied to the erase gate 60, such that electrons can escape from the first floating gate 40 to the erase gate 60 by Fowler-Nordheim tunneling. However, since a voltage applicable to type nonvolatile memory device formed in an isolated pocket well (block 100), applying a high voltage to the control gate and/or the erase gate of the split-gate type nonvolatile memory device (block 102) and applying a negative voltage to the pocket well (block 104). The negative voltage may be applied to the pocket well concurrently with applying the high voltage to the control gate and/or the erase gate. As described above, applying a negative voltage to the isolated pocket well of the split-gate type nonvolatile memory device may increase the efficiency of the program operation. Moreover, as the pocket well is isolated from, for example, other wells formed in the substrate having the same conductivity type, applying the negative voltage to the pocket well may not adversely affect the operation of semiconductor devices formed in the other wells.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A split-gate type nonvolatile memory device comprising:
    a semiconductor substrate having a first conductivity type;
    a deep well having a second conductivity type in the semiconductor substrate;
    a pocket well having the first conductivity type in the deep well, wherein the pocket well is isolated from the substrate by the deep well;
    a source line region having the second conductivity type in the pocket well;
    an erase gate on the source line region; and
    a first floating gate and a first control gate stacked sequentially on the pocket well on a first side of the erase gate;
    a first bit line region having the second conductivity type in the pocket well, wherein the first bit line region is spaced apart from the source line region;
    a first select gate on the pocket well between the first bit line region and the source line region, wherein the first select gate is adjacent to the first bit line region, wherein the first floating gate and the first control gate are between the first select gate and the erase gate;
    a second floating gate and a second control gate stacked sequentially on the pocket well on a second side of the erase gate;
    a second bit line region having the second conductivity type in the pocket well, wherein the second bit line region is spaced apart from the source line region; and
    a second select gate on the pocket well between the second bit line region and the source line region and adjacent to the second bit line region, wherein the second floating gate and the second control gate are between the second select gate and the erase gate.

2. The nonvolatile memory device of claim 1, wherein the erase gate, the first floating gate and the first control gate are on a top surface of the pocket well, and opposing side surfaces and a bottom surface of the pocket well are surrounded by the deep well.

3. The nonvolatile memory device of claim 1, wherein the pocket well is configured to receive a negative voltage during a program operation of the nonvolatile memory device.

4. The nonvolatile memory device of claim 3, wherein the pocket well is configured to receive a negative voltage in a range of 0.1 to 2 V.

5. The nonvolatile memory device of claim 3, wherein the pocket well is configured to receive a ground voltage during an erase operation and/or a read operation of the nonvolatile memory device.

6. A split-gate type nonvolatile memory device comprising:
    a semiconductor substrate having a first conductivity type;
    a deep well having a second conductivity type in the semiconductor substrate;
    a pocket well having the first conductivity type in the deep well, wherein the pocket well is isolated from the substrate by the deep well;
    a source line region having the second conductivity type in the pocket well;
    an erase gate on the source line region;
    a first floating gate and a first control gate stacked sequentially on the pocket well on a first side of the erase gate;
    a first bit line region having the second conductivity type in the pocket well, wherein the first bit line region is spaced apart from the source line region; and
    a first select gate on the pocket well between the first bit line region and the source line region, wherein the first select gate is adjacent to the first bit line region,
    wherein the first floating gate and the first control gate are between the first select gate and the erase gate;
    wherein during the program operation of the nonvolatile memory device, a voltage of −0.1 V to −2 V is applied to the pocket well, a voltage of 3 V to 7 V is applied to the source line region, a voltage of 3 V to 11 V is applied to the erase gate, a voltage of 7 V to 11 V is applied to the first control gate, a voltage of 0 V to 0.7 V is applied to the first bit line region, and a voltage of 0 V to 3 V is applied to the first select gate.

7. The nonvolatile memory device of claim 1, further comprising a logic gate that is spaced apart from the pocket well and that is formed on the semiconductor substrate.

8. The nonvolatile memory device of claim 1, further comprising:
    a first well having the first conductivity type, wherein the first well is in the deep well and is spaced apart from the pocket well; and
    a metal oxide semiconductor transistor on the first well;
    wherein the first well is electrically isolated from the pocket well by the deep well.

9. The nonvolatile memory device of claim 1, wherein the deep well comprises a first deep well, the nonvolatile memory device further comprising:
    a second deep well having the second conductivity type in the substrate and spaced apart from the first deep well;
    a third well having the first conductivity type in the second deep well; and
    a metal oxide semiconductor transistor on the third well;
    wherein the third well is electrically isolated from the substrate by the second deep well.

10. A semiconductor device comprising:
    a semiconductor substrate having a first conductivity type, the semiconductor substrate comprising a first region and a second region;
    a deep well having a second conductivity type in the first region;
    a pocket well having the first conductivity type in the deep well;
    a split-gate type nonvolatile memory device on the pocket well and comprising a floating gate and a control gate;
    a first logic device on the first region, wherein the first logic device comprises a first well having the first conductivity type in the deep well and a second well having the second conductivity type outside the deep well, wherein the first logic device is electrically isolated from the pocket well; and
    a second logic device on the second region; wherein the second logic device is electrically isolated from the pocket well.

11. The semiconductor device of claim 10, wherein the pocket well is configured to receive a negative voltage during a program operation of the nonvolatile memory device.

12. The semiconductor device of claim 11, wherein the pocket well is configured to receive a ground voltage during an erase operation and/or a read operation of the nonvolatile memory device.

13. The semiconductor device of claim 10, wherein the nonvolatile memory device further comprises an erase gate and a select gate on the pocket well, wherein the erase gate and the select gate are spaced apart from each other, and the floating gate and the control gate are stacked sequentially between the erase gate and the select gate.

14. The semiconductor device of claim 10, wherein the control gate overlaps part of a top surface of the floating gate.

15. A method of programming a split-gate type nonvolatile memory device including a semiconductor substrate having a first conductivity type, a deep well having a second conductivity type in the semiconductor substrate, a pocket well having the first conductivity type in the deep well, a source line region having the second conductivity type in the pocket well, an erase gate on the source line region, and a first floating gate and a first control gate stacked sequentially on the pocket well on a first side of the erase gate, the method comprising:
applying a high voltage to the first control gate and/or to the erase gate;
applying a negative voltage of −0.1 V to −2 V to the pocket well; and
applying a voltage of 3 V to 7 V to the source line region, applying a voltage of 3 V to 11 V to the erase gate, and applying a voltage of 7 V to 11 V to the first control gate.

16. The method of claim 15, further comprising applying the high voltage to the first control gate and/or to the erase gate concurrently with applying the negative voltage to the pocket well.

* * * * *